US008240798B2

(12) United States Patent
Oshima et al.

(10) Patent No.: US 8,240,798 B2
(45) Date of Patent: *Aug. 14, 2012

(54) HEAD DRIVE APPARATUS OF INKJET PRINTER AND INKJET PRINTER

(75) Inventors: Atsushi Oshima, Shiojiri (JP); Kunio Tabata, Shiojiri (JP); Osamu Shinkawa, Chino (JP); Toshiyuki Suzuki, Shiojiri (JP); Tomoki Hatano, Higashiomi (JP)

(73) Assignee: Seiko Epson Corporation, Tokyo (JP)

( * ) Notice: Subject to any disclaimer, the term of this patent is extended or adjusted under 35 U.S.C. 154(b) by 241 days.

This patent is subject to a terminal disclaimer.

(21) Appl. No.: 12/161,201

(22) PCT Filed: Jan. 17, 2007

(86) PCT No.: PCT/JP2007/050610

§ 371 (c)(1), (2), (4) Date: Jul. 17, 2008

(87) PCT Pub. No.: WO2007/083671

PCT Pub. Date: Jul. 26, 2007

(65) Prior Publication Data

US 2010/0220133 A1 Sep. 2, 2010

(30) Foreign Application Priority Data

Jan. 20, 2006 (JP) ................................ 2006-012472

(51) Int. Cl.
*B41J 29/38* (2006.01)
*H03F 3/38* (2006.01)

(52) U.S. Cl. ........................................... 347/10; 330/10

(58) Field of Classification Search .................... 347/10
See application file for complete search history.

(56) References Cited

U.S. PATENT DOCUMENTS

| | | | | |
|---|---|---|---|---|
| 2,915,589 | A * | 12/1959 | Plant | 704/276 |
| 4,254,439 | A | 3/1981 | Fowler et al. | |
| 4,992,749 | A | 2/1991 | Tokumo et al. | |
| 5,262,733 | A | 11/1993 | Nakajima et al. | |
| 5,283,658 | A | 2/1994 | Hayashi et al. | |

(Continued)

FOREIGN PATENT DOCUMENTS

EP 1594224 11/2005

(Continued)

OTHER PUBLICATIONS

U.S. Appl. No. 12/637,412, filed Dec. 14, 2009, Oshima et al.

(Continued)

*Primary Examiner* — Shelby Fidler
(74) *Attorney, Agent, or Firm* — Workman Nydegger

(57) ABSTRACT

A head drive device of an inkjet printer having a nozzles and corresponding actuators that jet liquid drops. A drive section that generates a drive signal to the actuators. The head drive device includes a drive waveform signal which is used as a reference of a signal to control drive of the actuators. A modulating section modulates a pulse of a drive waveform signal generated by the drive waveform generating system. A low pass filter smoothes a power-amplified modulated signal subjected to the power amplification by the digital power amplifier and supplies the signal as a drive signal to the actuators. A frequency characteristics adjusting section adjusts frequency characteristics of the low pass filter as a function of the number of the actuators.

4 Claims, 13 Drawing Sheets

U.S. PATENT DOCUMENTS

| | | | |
|---|---|---|---|
| 5,406,314 | A | 4/1995 | Kuehnle |
| 5,475,405 | A | 12/1995 | Widder et al. |
| 5,675,296 | A | 10/1997 | Tomikawa |
| 5,894,314 | A | 4/1999 | Tajika et al. |
| 6,133,844 | A | 10/2000 | Ahne et al. |
| 6,267,519 | B1 | 7/2001 | Otsuki et al. |
| 6,312,076 | B1 | 11/2001 | Taki et al. |
| 6,312,096 | B1 | 11/2001 | Koitabashi et al. |
| 6,320,605 | B1 | 11/2001 | Ikeda et al. |
| 6,344,811 | B1 | 2/2002 | Melanson |
| 6,364,443 | B1 | 4/2002 | Katano et al. |
| 6,378,996 | B1 | 4/2002 | Shimada |
| 6,431,676 | B2 | 8/2002 | Asauchi et al. |
| 6,443,547 | B1 | 9/2002 | Takahashi et al. |
| 6,454,377 | B1 | 9/2002 | Ishizaki |
| 6,457,794 | B1 | 10/2002 | Tajika et al. |
| 6,474,762 | B2 | 11/2002 | Taki et al. |
| 6,502,930 | B1 | 1/2003 | Shimada |
| 6,652,055 | B2 | 11/2003 | Oikawa |
| 6,739,686 | B2 * | 5/2004 | Imai ................................ 347/10 |
| 6,776,469 | B2 | 8/2004 | Nozawa |
| 6,929,340 | B2 | 8/2005 | Ishizaki |
| 7,038,534 | B2 | 5/2006 | Hanzlik |
| 7,083,274 | B2 | 8/2006 | Morita |
| 7,111,755 | B2 | 9/2006 | Koyama et al. |
| 7,170,544 | B2 | 1/2007 | Horiuchi |
| 7,244,007 | B2 | 7/2007 | Ishizaki |
| 7,252,355 | B2 | 8/2007 | Umeda |
| 7,357,496 | B2 | 4/2008 | Silverbrook |
| 7,384,128 | B2 | 6/2008 | Sheahan et al. |
| 7,571,989 | B2 | 8/2009 | Ishizaki |
| 7,717,530 | B2 | 5/2010 | Oshima |
| 7,731,317 | B2 | 6/2010 | Oshima |
| 7,748,812 | B2 | 7/2010 | Oshima |
| 7,758,140 | B2 | 7/2010 | Oshima et al. |
| 1,333,364 | A1 | 12/2011 | Tabata et al. |
| 2001/0040595 | A1 | 11/2001 | Taki et al. |
| 2002/0018085 | A1 | 2/2002 | Asauchi et al. |
| 2002/0113832 | A1 | 8/2002 | Kanematsu |
| 2002/0142733 | A1 * | 10/2002 | Nishinakagawa .............. 455/84 |
| 2002/0163458 | A1 | 11/2002 | Jin |
| 2003/0112297 | A1 | 6/2003 | Hiratsuka et al. |
| 2003/0231179 | A1 | 12/2003 | Suzuki |
| 2004/0047477 | A1 * | 3/2004 | Bank et al. .................... 381/120 |
| 2004/0119770 | A1 | 6/2004 | Tamura |
| 2004/0227807 | A1 | 11/2004 | Horiuchi |
| 2004/0233241 | A1 | 11/2004 | Salacz |
| 2005/0116977 | A1 | 6/2005 | Shinkawa et al. |
| 2005/0231179 | A1 * | 10/2005 | Ishizaki ........................ 323/234 |
| 2005/0248399 | A1 | 11/2005 | Kurokawa |
| 2006/0132231 | A1 | 6/2006 | Ishii et al. |
| 2006/0181342 | A1 | 8/2006 | Kanoh |
| 2007/0079710 | A1 | 4/2007 | Ishizaki |
| 2007/0120938 | A1 | 5/2007 | Fitzpatrick et al. |
| 2007/0126845 | A1 | 6/2007 | Silverbrook et al. |
| 2007/0165074 | A1 | 7/2007 | Ishizaki |
| 2008/0018683 | A1 | 1/2008 | Oshima et al. |
| 2008/0018685 | A1 | 1/2008 | Tabata et al. |
| 2008/0018686 | A1 | 1/2008 | Oshima et al. |
| 2008/0018687 | A1 | 1/2008 | Tabata et al. |
| 2008/0100652 | A1 | 5/2008 | Oshima et al. |
| 2008/0186350 | A1 | 8/2008 | Oshima et al. |
| 2008/0198191 | A1 | 8/2008 | Oshima |
| 2008/0218545 | A1 | 9/2008 | Oshima et al. |
| 2009/0033698 | A1 | 2/2009 | Suzuki et al. |
| 2009/0066739 | A1 | 3/2009 | Tabata et al. |
| 2009/0140780 | A1 | 6/2009 | Miyazaki et al. |
| 2009/0174738 | A1 | 7/2009 | Oshima |
| 2009/0213152 | A1 | 8/2009 | Tabata et al. |
| 2009/0267979 | A1 | 10/2009 | Tabata et al. |
| 2009/0289980 | A1 | 11/2009 | Tabata et al. |
| 2009/0303271 | A1 | 12/2009 | Tabata et al. |
| 2010/0091059 | A1 | 4/2010 | Oshima et al. |
| 2010/0097419 | A1 | 4/2010 | Oshima |
| 2010/0118078 | A1 | 5/2010 | Oshima et al. |
| 2010/0188452 | A1 | 7/2010 | Oshima |
| 2011/0102486 | A1 | 5/2011 | Tabata et al. |
| 2011/0109674 | A1 | 5/2011 | Oshima et al. |

FOREIGN PATENT DOCUMENTS

| | | | |
|---|---|---|---|
| JP | 63-247059 | | 10/1988 |
| JP | 02-262705 | | 10/1990 |
| JP | 03-147446 | A | 6/1991 |
| JP | 05-077456 | | 3/1993 |
| JP | 05-199044 | | 8/1993 |
| JP | 06-041208 | | 6/1994 |
| JP | 09/234865 | | 9/1997 |
| JP | 09-300618 | | 11/1997 |
| JP | 09-308264 | | 11/1997 |
| JP | 10-081013 | | 3/1998 |
| JP | 10-210757 | | 8/1998 |
| JP | 11-058733 | | 3/1999 |
| JP | 11-204850 | | 7/1999 |
| JP | 2000-117980 | | 4/2000 |
| JP | 2000-238262 | | 9/2000 |
| JP | 2000-245162 | | 9/2000 |
| JP | 2001-121697 | | 5/2001 |
| JP | 2001-162794 | | 6/2001 |
| JP | 2001-268922 | | 9/2001 |
| JP | 2002-204595 | | 7/2002 |
| JP | 2002-210958 | A | 7/2002 |
| JP | 2002-536903 | A | 10/2002 |
| JP | 2003-001824 | | 1/2003 |
| JP | 2003-237068 | | 8/2003 |
| JP | 2004-048886 | | 2/2004 |
| JP | 2004-306434 | | 11/2004 |
| JP | 2005-035062 | | 2/2005 |
| JP | 2005-065068 | | 3/2005 |
| JP | 2005-075475 | | 3/2005 |
| JP | 2005-131928 | | 5/2005 |
| JP | 2005-322957 | | 11/2005 |
| JP | 2005-329710 | | 12/2005 |
| JP | 2005-349576 | | 12/2005 |
| JP | 2006-025151 | | 1/2006 |
| JP | 2006-304490 | | 2/2006 |
| JP | 2006-231882 | | 9/2006 |
| JP | 2006-256151 | | 9/2006 |
| JP | 2006-272907 | | 10/2006 |
| JP | 2007-069555 | | 3/2007 |
| JP | 2007-096364 | | 4/2007 |
| JP | 2007-144867 | | 6/2007 |
| JP | 2007-168172 | | 7/2007 |
| JP | 2007-190708 | | 8/2007 |
| JP | 2008-049698 | | 3/2008 |
| JP | 2008-049699 | | 3/2008 |
| JP | 2008-087467 | | 4/2008 |
| WO | 00/46919 | A | 8/2000 |

OTHER PUBLICATIONS

U.S. Appl. No. 12/689,926, filed Jan. 19, 2010, Oshima et al.

U.S. Appl. No. 11/780,301, mail date Jun. 27, 2008, Office Action.

U.S. Appl. No. 11/780,301, mail date Feb. 20, 2009, Final Office Action.

U.S. Appl. No. 11/780,301, mail date Jun. 16, 2009, Notice of Allowance.

U.S. Appl. No. 11/780,357, mail date Oct. 28, 2009, Office Action.

U.S. Appl. No. 11/780,390, mail date Apr. 8, 2009, Notice of Allowance.

U.S. Appl. No. 11/849,582, mail date May 28, 2008, Office Action.

U.S. Appl. No. 11/849,582, mail date Dec. 30, 2009, Final Office Action.

U.S. Appl. No. 11/923,448, mail date Nov. 27, 2009, Office Action.

U.S. Appl. No. 12/752,367, filed Apr. 1, 2010, Oshima

U.S. Appl. No. 11/780,357, Mail date May 12, 2010, Final Office Action.

U.S. Appl. No. 11/849,582, Mail date Apr. 19, 2010, Notice of Allowance.

U.S. Appl. No. 11/923,448, Mail date Apr. 28, 2010, Final Office Action.

U.S. Appl. No. 11/780,379, Mail date Mar. 3, 2010, Office Action.

U.S. Appl. No. 12/351,472, Mail date Jan. 4, 2010, Notice of Allowance.

U.S. Appl. No. 12/340,940, Mail date Apr. 12, 2010, Notice of Allowance.

U.S. Appl. No. 12/161,148, Mail date Mar. 30, 2010, Office Action.

U.S. Appl. No. 11/780,379, Mail date Aug. 20, 2010, Final Office Action.
U.S. Appl. No. 12/161,148, Mail date Sep. 16, 2010, Final Office Action.
U.S. Appl. No. 12/509,915, Mail date Sep. 30, 2010, Office Action.
U.S. Appl. No. 12/637,412, Mail date Aug. 23, 2010, Office Action.
U.S. Appl. No. 12/752,367, Mail date Oct. 8, 2010, Office Action.
European Search Report cited in European Application No. 07706915.1 dated Jan. 28, 2010.
U.S. Appl. No. 12/637,412, mailed Jun. 14, 2011, Notice of Allowance.
U.S. Appl. No. 12/026,129, mailed Dec. 27, 2010, Office Action.
U.S. Appl. No. 12/026,126, mailed Jun. 14, 2011, Office Action.
U.S. Appl. No. 11/780,357, mailed Mar. 4, 2011, Office Action.
U.S. Appl. No. 11/780,379, mailed Mar. 4, 2011, Office Action.
U.S. Appl. No. 12/689,926, mailed Nov. 30, 2010, Office Action.
U.S. Appl. No. 12/498,296, mailed Dec. 17, 2010, Notice of Allowance.
U.S. Appl. No. 11/972,542, mailed Apr. 5, 2010, Notice of Allowance.
U.S. Appl. No. 12/027,175, mailed Dec. 27, 2010, Office Action.
U.S. Appl. No. 12/351,472, mailed Jan. 4, 2010, Notice of Allowance.
U.S. Appl. No. 12/389,525, mailed Jan. 9, 2012, Office Action.
U.S. Appl. No. 12/161,201, mailed Jan. 13, 2012, Notice of Allowance.
Japanese Office Action dated Nov. 1, 2011, cited in Japanese Application No. 2007-181649.
U.S. Appl. No. 12/158,591, mailed Oct. 27, 2011, Office Action.
U.S. Appl. No. 12/161,148, mailed Mar. 21, 2011, Office Action.
U.S. Appl. No. 12/161,148, mailed Sep. 2, 2011, Notice of Allowance.
U.S. Appl. No. 12/161,148, mailed Oct. 11, 2011, Supplemental Notice of Allowance.
U.S. Appl. No. 12/637,412, mailed Nov. 25, 2011, Notice of Allowance.
U.S. Appl. No. 12/624,206, mailed Oct. 11, 2011, Office Action.

* cited by examiner

HEAD DRIVE APPARATUS OF INKJET PRINTER AND INKJET PRINTER

BACKGROUND

1. Technical Field

The present invention relates to an inkjet printer in which a plurality of nozzles jet minute ink drops of liquid ink of a plurality of colors and particles of the ink (ink dots) are formed on a print medium to draw pre-determined characters and images.

2. Related Art

An inkjet printer as in the above generally accomplishes low-cost and high-quality color printed material easily. As such, it is widely used not only in offices but also by general users along with popularization of a personal computer and a digital camera.

Generally, in such an inkjet printer, a moving part called a carriage, for example, integrally comprising ink cartridges and print heads moves back and forth on a print medium in a direction crossing a direction to convey the medium, and nozzles of the print head jet (eject) liquid ink drops to form minute ink dots on the print medium. In this manner, pre-determined characters or images are drawn on the print medium to create desired printed material. The carriage comprises ink cartridges for four colors including black (and yellow, magenta, cyan) and a print head for each of the colors, so that not only monochrome print but also full color print in combination of the respective colors can be easily performed (further, print in six colors including the colors, light cyan and light magenta, seven colors, and eight colors are practically implemented).

In the above type of inkjet printer for executing print by moving the inkjet heads on the carriage back and forth in a direction crossing a direction to convey a print medium in the above manner, the inkjet heads must be moved back and forth about ten times to more than tens of times to neatly print a whole page. Therefore, it has a drawback in that it takes a longer time for printing than a print apparatus in another scheme, for example, a laser printer or a copying machine using electrographic technique.

On the other hand, in an inkjet printer comprising inkjet heads (do not need to be integrated) of the same length as the width of a print medium but not comprising a carriage, the inkjet heads do not need to be moved in a width direction of the print medium so that one-pass printing is possible, enabling quick printing similar to a laser printer. An inkjet printer in the former scheme is generally called a “multi-pass (serial) inkjet printer”, while an inkjet printer in the latter scheme is generally called a “line head inkjet printer”.

The above types of inkjet printers are required to provide further higher gradation. Gradation is the density of each color included in a pixel represented by an ink dot: the size of an ink dot depending on the density of a color of each pixel is called gradient, while the number of gradients represented by an ink dot is called the number of gradations. High gradation means that the number of gradations is large. To change gradient, it is necessary to change a drive pulse to an actuator provided to an inkjet head. For example, if an actuator is a piezoelectric element, when a voltage value applied to the piezoelectric element is large, the magnitude of displacement (distortion) of the piezoelectric element (precisely, a vibrating plate) is also large. This is used to change the gradient of an ink dot.

According to JP-A-10-81013, a plurality of drive pulses having different voltage peak values are combined and coupled to generate a drive signal. The signal is output commonly to piezoelectric elements of nozzles for the same color provided to an inkjet head. According to the drive signal, a drive pulse for the gradient of an ink dot to be formed is selected for each nozzle. The selected drive pulse is supplied to a piezoelectric element of an appropriate nozzle to jet an ink drop. In this manner, a requested gradient of an ink dot is achieved.

A method for generating a drive signal (or drive pulse) is illustrated in FIG. 2 of JP-A-2004-306434. That is, data is read out from a memory for storing drive signal data, a D/A converter converts the data into analog data, and a drive signal is supplied to an inkjet head through a current amplifier. A circuit of the current amplifier comprises transistors in push-pull connection, as shown in FIG. 3 of the document, in which a linear drive amplifies a drive signal. However, in a current amplifier with such configuration, a linear drive itself of a transistor is inefficient. Moreover, such an amplifier has a drawback of a large circuit size since the transistor itself should be large for a countermeasure against heat, and the transistor needs a cooling plate radiator. Particularly, the largeness of the cooling plate radiator is a major obstacle to the layout.

To resolve the drawback, JP-A-2005-035062 discloses an inkjet printer for generating a drive signal by controlling the reference voltage of a DC/DC converter. According to the document, an efficient DC/DC converter is used to dispense with a radiating unit for cooling. Additionally, a PWM signal is used so that a D/A converter can be realized using a simple low-pass filter. These can realize a small circuit.

However, a DC/DC converter is originally designed to generate a constant voltage. As such, the head drive apparatus of an inkjet printer using the DC/DC converter in JP-A-2005-035062 has a problem in that a waveform, for example, rapid rise and fall of a drive signal cannot be gained necessary for an inkjet head to jet ink drops well. Of course, the head drive apparatus of an inkjet printer in which a pair of transistors in push-pull connection amplifies current of an actuator drive signal in JP-A-2004-306434 has a problem in that a cooling plate radiator is so large that it cannot be actually laid out particularly in a line head inkjet printer having a large number of nozzles, i.e., a large number of actuators.

SUMMARY

An object of the present invention is to provide a head drive apparatus of an inkjet printer that enables rapid rise and fall of a drive signal to an actuator, does not require a cooling unit such as a cooling plate radiator, and makes drive signals actually applied to actuators uniform.

[First Aspect]

To solve the above problems, a head drive apparatus of an inkjet printer according to a first aspect is characterized by including: a plurality of nozzles for jetting liquid drops that are provided for an inkjet head; actuators provided in correspondence to the nozzles; and a drive unit that applies a drive signal to the actuators, and further including: a drive waveform generator that generates a drive waveform signal which is used as a reference of a signal to control drive of the actuators; a modulator that pulse modulates a drive waveform signal generated by the drive waveform generator; a digital power amplifier for amplifying power of a modulated signal subjected to the pulse modulation by the modulator; a low pass filter for smoothing an amplified digital signal subjected to the power amplification by the digital power amplifier and supplying the signal as a drive signal to the actuators; and a frequency characteristics adjusting unit that adjusts frequency characteristics of the low pass filter as a function of the number of the actuators.

In the head drive apparatus of an inkjet printer according to the first aspect, the drive waveform generator generates a drive waveform signal which is used as a reference of a signal to control drive of the actuators, the modulator pulse modulates the generated drive waveform signal, the digital power amplifier amplifies the power of the modulated signal subjected to the pulse modulation, and the low pass filter smoothes the amplified digital signal subjected to the power amplification and supplies the signal as a drive signal to the actuator. Thus, filter characteristics of the low pass filter are set to sufficiently smooth only a amplified digital signal component so that rapid rise and fall of a drive signal to the actuators are enabled and the digital power amplifier with efficient power amplification can efficiently amplify the power of a drive signal. This allows the device to dispense with a cooling unit such as a cooling plate radiator.

The head drive apparatus is configured so that frequency characteristics of the low pass filter is adjusted depending on the number of the actuators, thereby the low-pass filter in the drive circuit removes only certain components or only the components within a predetermined range, which makes drive signals actually applied to actuators constant.

[Second Aspect]

A head drive apparatus of an inkjet printer according to a second aspect of the present invention is characterized by that, in the head drive apparatus of an inkjet printer according to the first aspect, the frequency characteristics adjusting unit comprises: a plurality of capacitances which can be connected in parallel relative to the amplified digital signal; and switches for individually connecting to the plurality of capacitances to the amplified digital signal.

According to a head drive apparatus of an inkjet printer of the second aspect of the present invention, since the head drive apparatus is configured to have a plurality of capacitances which can be connected in parallel to the amplified digital signal; and a switch for individually connecting the plurality of capacitances to the amplified digital signal, with the smaller number of the actuators and the larger capacitance which is connected in parallel to the amplified digital signal, the low-pass filter in the drive circuit can remove only certain components or only the components within a predetermined range, which can make drive signals actually applied to actuators uniform.

[Third Aspect]

A head drive apparatus of an inkjet printer according to a third aspect of the present invention is characterized by that, in the head drive apparatus of an inkjet printer according to the second aspect, the frequency characteristics adjusting unit increases the capacitance connected in parallel to the amplified digital signal for the smaller number of the actuators.

According to the head drive apparatus of an inkjet printer of the third aspect of the present invention, since the head drive apparatus is configured so that the capacitance connected in parallel to the amplified digital signal is increased for the smaller number of the actuators, thereby the low-pass filter in the drive circuit can remove only certain components or only the components within a predetermined range, which can make drive signals actually applied to actuators uniform.

DESCRIPTION OF SYMBOLS

1: print medium; 2: first inkjet head; 3: second inkjet head; 4: first conveyor unit; 5: second conveyor unit; 6: first conveyor belt; 7: second conveyor belt; 8R and 8L: drive rollers; 9R and 9L: first driven rollers; 10R and 10L: second driven rollers; 11R and 11L: electric motors; 24: modulator; 25: digital power amplifier; 26: low pass filter; 31: comparator; 32: triangular wave oscillator; 33: half bridge driver stage; 34: gate drive circuit; 41: memory controller; 42: memory unit; 43: numerical value generator; 44: comparing unit; 70: drive waveform generator.

DESCRIPTION OF EXEMPLARY EMBODIMENTS

A first embodiment of an inkjet printer according to the present invention will be described with reference to the drawings.

Figure 1A:
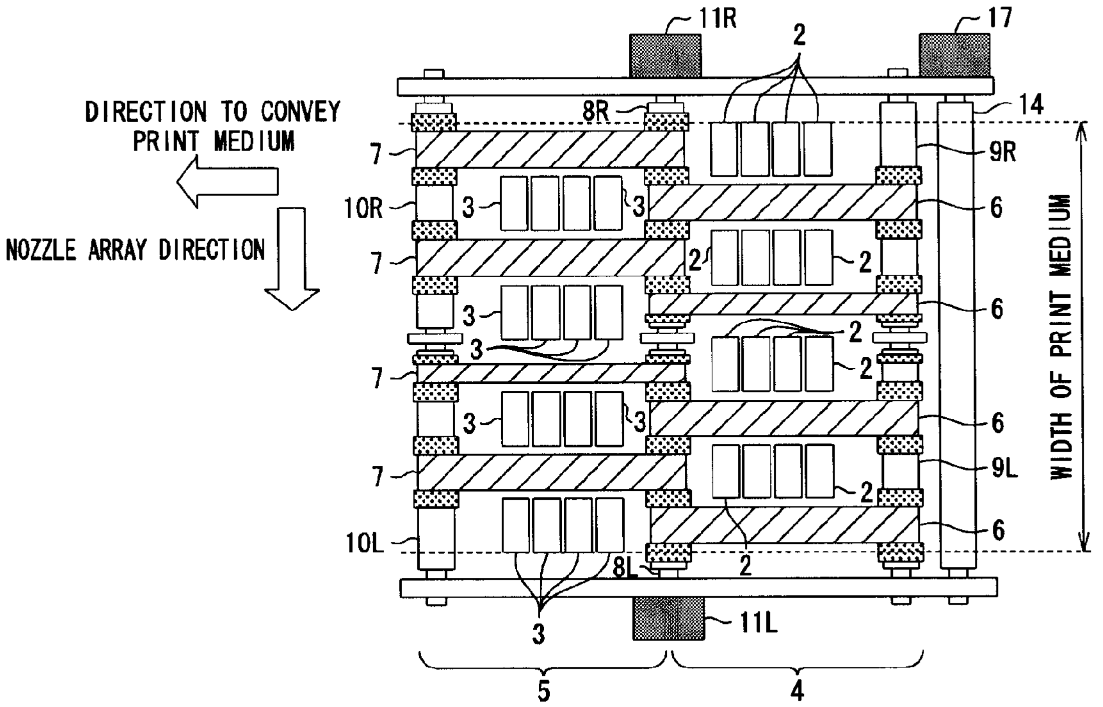
FIGS. 1A and 1B are the overall configuration diagrams showing a line head inkjet printer to which a head drive apparatus of the inkjet printer according to the present invention is applied: (a) is a top plain view, and (b) is a front view.
Figure 1B:
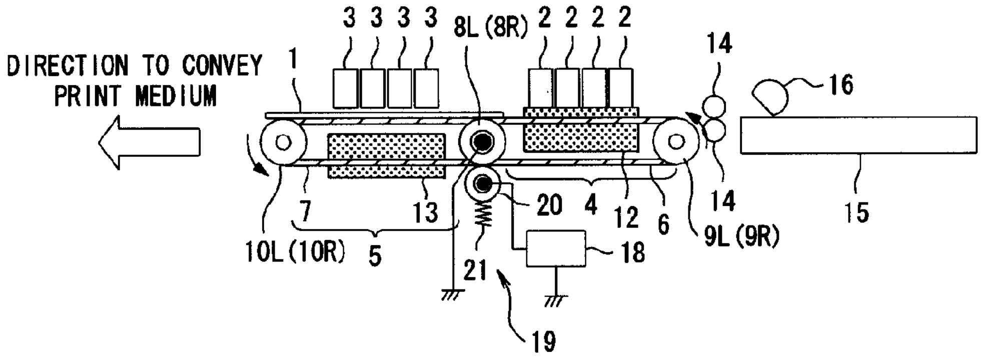

FIGS. 1A and 1B are the overall configuration diagrams of an inkjet printer according to this embodiment: FIG. 1A is a top plain view of the printer; and FIG. 1B is a front view of the printer. In FIGS. 1A and 1B, a print medium 1 is a line head inkjet printer that is conveyed in a direction from the right to the left indicated by the arrow of the drawing and printed in a printing area on the way of the conveyor. However, the inkjet head according to the present embodiment is not arranged only at one place, but two inkjet heads are arranged at two places.

Reference numeral 2 in the drawing denotes a first inkjet head being provided on the upstream side of the direction in which the print medium 1 is conveyed, and reference numeral 3 denotes a second inkjet head being provided on the downstream side of the direction. A first conveyor unit 4 is provided below the first inkjet heads 2 that carries the print medium 1, while a second conveyor unit 5 is provided below the second inkjet heads 3. The first conveyor unit 4 includes four first conveyor belts 6 which are arranged with predetermined space therebetween in the direction crossing the direction in which the print medium 1 is conveyed (hereinafter, also referred to as a nozzle array direction), and the second conveyor unit 5 similarly includes four second conveyor belts 7 which are arranged with predetermined space therebetween in the direction (nozzle array direction) crossing the direction in which the print medium 1 is conveyed.

The four first conveyor belts 6 and the similar four second conveyor belts 7 are arranged alternately so as to be adjacent to each other. This embodiment divides the conveyor belts into two of the first conveyor belts 6 and two of the second conveyor belts 7 on the left side in the nozzle array direction, and two of the first conveyor belts 6 and two of the second conveyor belts 7 on the right side in the nozzle array direction. That is, a right drive roller 8R is provided through an overlapping part of the two first conveyor belts 6 and the two second conveyor belts 7 on the right side in the nozzle array direction. A left drive roller 8L is provided through an overlapping part of the two first conveyor belts 6 and the two second conveyor belts 7 on the left side in the nozzle array direction. A first right driven roller 9R and a first left driven roller 9L are provided on the upstream side, while a second right driven roller 10R and a second left driven roller 10L are provided on the downstream side. The rollers are practically separated at the center part of FIG. 1A, though they individually seem to be continuous rollers. The two first conveyor belts 6 on the right side in the nozzle array direction are wound around the right drive roller 8R and the first right driven roller 9R, and the two first conveyor belts 6 on the left side in the nozzle array direction are wound around the left drive roller 8L and the first left driven roller 9L. The two second conveyor belts 7 on the right side in the nozzle array direction are wound around the right drive roller 8R and the second right driven roller 10R, the two second conveyor belts 7 on the left side in the nozzle array direction are wound around the left drive roller 8L and the second left driven roller 10L. The right drive roller 8R is connected to the right electric motor 11R, while the left drive roller 8L is connected to the left electric motor 11L. Therefore, when the right electric motor 11R rotates the right drive roller 8R, the first conveyor unit 4 having the two first conveyor belts 6 on the right side in the nozzle array direction and the second conveyor unit 5 similarly having the two second conveyor belts 7 on the right side in the nozzle array direction synchronize with each other and move at the same speed. When the left electric motor 11L rotates the left drive roller 8L, the first conveyor unit 4 having the two first conveyor belts 6 on the left side in the nozzle array direction and the second conveyor unit 5 similarly having the two second conveyor belts 7 on the left side in the nozzle array direction synchronize with each other and move at the same speed. However, if the right electric motor 11R and the left electric motor 11L rotate at different speeds, conveyor speeds on left and right sides in the nozzle array direction can be different from each other. Specifically, if the right electric motor 11R rotates faster than the left electric motor 11L, the conveyor speed of the right side in the nozzle array direction can be higher than that of the left side. If the left electric motor 11L rotates faster than the right electric motor 11R, the conveyor speed of the left side in the nozzle array direction can be higher than that of the right side.

The first inkjet heads 2 and the second inkjet heads 3 are arranged offset from each other in the direction in which the print medium 1 is conveyed for each of four colors of yellow (Y), magenta (M), cyan (C) and black (K). To the respective inkjet heads 2 and 3, ink is supplied from ink tanks (not shown) for the respective colors via ink supply tubes. Each of the inkjet heads 2 and 3 has a plurality of nozzles formed therein in the direction crossing the direction in which the print medium 1 is conveyed (i.e., the nozzle array direction). The nozzles simultaneously jet a necessary amount of ink drops to a necessary position to form and output minute ink dots on the print medium 1. This is performed for each color so that only one pass of the print medium 1 conveyed by the first conveyor unit 4 and the second conveyor unit 5 enables one-pass printing thereon. That is, the areas where the inkjet heads 2 and 3 are arranged correspond to printing areas.

A method for jetting ink from each nozzle of an inkjet head includes an electrostatic scheme, a piezoelectric inkjet, and a film-boiling ink jet. In the electrostatic scheme, an application of a drive signal to an electrostatic gap which functions as an actuator causes a displacement of a vibrating plate in a cavity and a pressure change in the cavity, which the causes ink drops to be jetted from a nozzle. In the piezoelectric inkjet, an application of a drive signal to a piezoelectric element which functions as an actuator causes a displacement of a vibrating plate in a cavity and a pressure change in the cavity, which causes ink drops to be jetted from a nozzle. In the film-boiling ink jet, a micro heater in a cavity is instantaneously heated to a temperature of 300 degrees or more, so as to cause a film-boiling state of ink and generate bubbles in the ink, resulting in a pressure change which causes ink drops to be jetted from a nozzle. The present invention can be applied to any of the above inkjet methods, but among them, is particularly preferable to a piezoelectric element since the amount of ink drop ejection can be adjusted by controlling a peak voltage or a voltage gradient of a drive signal.

The ink drop jetting nozzles of the first inkjet heads 2 are formed only between the four first conveyor belts 6 of the first conveyor unit 4, while the ink drop jetting nozzles of the second inkjet heads 3 are formed only between the four second conveyor belts 7 of the second conveyor unit 5. This allows a cleaning unit which will be described below to clean the respective inkjet heads 2 and 3, but in this configuration, one-pass full-page printing cannot be accomplished only by either of the inkjet heads. Accordingly, in order to cover the areas where either of the inkjet heads cannot print, the first inkjet heads 2 and the second inkjet heads 3 are arranged offset from each other in the direction in which the print medium 1 is conveyed.

A first cleaning cap 12 for cleaning the first inkjet heads 2 is provided under the first inkjet heads 2, while a second cleaning cap 13 for cleaning the second inkjet heads 3 is provided under the second inkjet heads 3. Both of the cleaning caps 12 and 13 are formed to have a size which can pass between the four first conveyor belts 6 of the first conveyor unit 4 and between the four second conveyor belts 7 of the second conveyor unit 5, respectively. The cleaning caps 12 and 13 individually include: a square cap body with a bottom that covers the nozzles formed in the bottom surfaces of the inkjet heads 2 and 3, i.e., the nozzle side surface, and can be adhered to the nozzle side surface; an ink absorber provided on the bottom thereof; a tube pump connected to the bottom of the cap body; and an elevator for moving up and down the cap body. Thus, the elevator moves up the cap body to adhere the body to each nozzle side surface of the inkjet heads 2 and 3. When the tube pump creates a negative pressure in the cap body as such, ink drops and bubbles are sucked up through the nozzles which are open in the nozzle side surface of the inkjet heads 2 and 3, which cleans the inkjet heads 2 or 3. When the cleaning is finished, the cleaning caps 12 and 13 are moved down.

On the upstream side of the first driven rollers 9R and 9L, a pair of gate rollers 14 is provided for controlling timing to feed the print medium 1 supplied from a paper feeder 15 and for correcting the skew of the print medium 1. The skew is torsion of the print medium 1 relative to the conveyor direction. A pickup roller 16 for supplying the print medium 1 is provided above the paper feeder 15. Reference numeral 17 in the drawing denotes a gate roller motor for driving the gate rollers 14.

A belt charging unit 19 is provided below the drive rollers 8R and 8L. The belt charging unit 19 includes: a charging roller 20 contacting the first conveyor belts 6 and the second conveyor belts 7 across the drive rollers 8R and 8L; a spring 21 for pressing the charging roller 20 against the first conveyor belts 6 and the second conveyor belts 7; and a power source 18 for imparting electric charge to the charging roller 20, and the electric charge is imparted from the charging roller 20 to the first conveyor belts 6 and the second conveyor belts 7 for charging. Generally, when such a type of belt which includes a medium or high resistor or insulator is charged by the belt charging unit 19, the electric charge transferred to the surface thereof induces polarization to the print medium 1 which also includes a high resistor or insulator. The electrostatic force between electric charge generated by the induced polarization and electric charge of the belt surface allows the print medium 1 to be adsorbed to the belt. The belt charging unit 19 may be a corotron which sprays electric charge.

Therefore, according to the inkjet printer, the belt charging unit 19 charges the surfaces of the first conveyor belts 6 and the second conveyor belts 7, and in the state, the gate rollers 14 feeds the print medium 1 to be pressed against the first conveyor belt 6 by a paper pressing roller which is configured with a spur or a roller (not shown). Then, the print medium 1 is adsorbed to the surface of the first conveyor belts 6 by the operation of the induced polarization described above. In this state, a rotation of the drive rollers 8R and 8L by the electric motors 11R and 11L causes the generated rotary drive force to be transmitted to the first driven rollers 9R and 9L via the first conveyor belts 6.

With the print medium 1 adsorbed as described above, the first conveyor belts 6 are moved downstream in the conveyor direction to cause the print medium 1 to be moved to a position under the first inkjet heads 2, so that ink drops are jetted through the nozzles formed in the first inkjet head 2 for printing. When the printing by the first inkjet heads 2 is finished, the print medium 1 is moved downstream in the conveyor direction to be transferred to the second conveyor belts 7 of the second conveyor unit 5. As described above, since the surfaces of the second conveyor belts 7 are also charged by the belt charging unit 19, the operation of the induced polarization described above causes the print medium 1 to be adsorbed to the surfaces of the second conveyor belts 7.

In this state, the second conveyor belts 7 are moved downstream in the conveyor direction to cause the print medium 1 to be moved to a position under the second inkjet head 3, so that ink drops are jetted through the nozzles formed in the second inkjet head for printing. When the printing by the second inkjet head is finished, the print medium 1 is further moved downstream in the conveyor direction to be separated from the surface of the second conveyor belts 7 by a separator (not shown) and ejected into a paper ejector.

If the first and second inkjet heads 2 and 3 need to be cleaned, as described above, the first and second cleaning caps 12 and 13 are moved upward to adhere the cap body to the nozzle side surface of the first and second inkjet heads 2 and 3. In that state, a negative pressure is created in the cap body to suck up ink drops and bubbles through the nozzles of the first and second inkjet heads 2 and 3 so as to clean the first and second inkjet heads 2 and 3. After the cleaning, the first and second cleaning caps 12 and 13 are moved downward.

Figure 2:
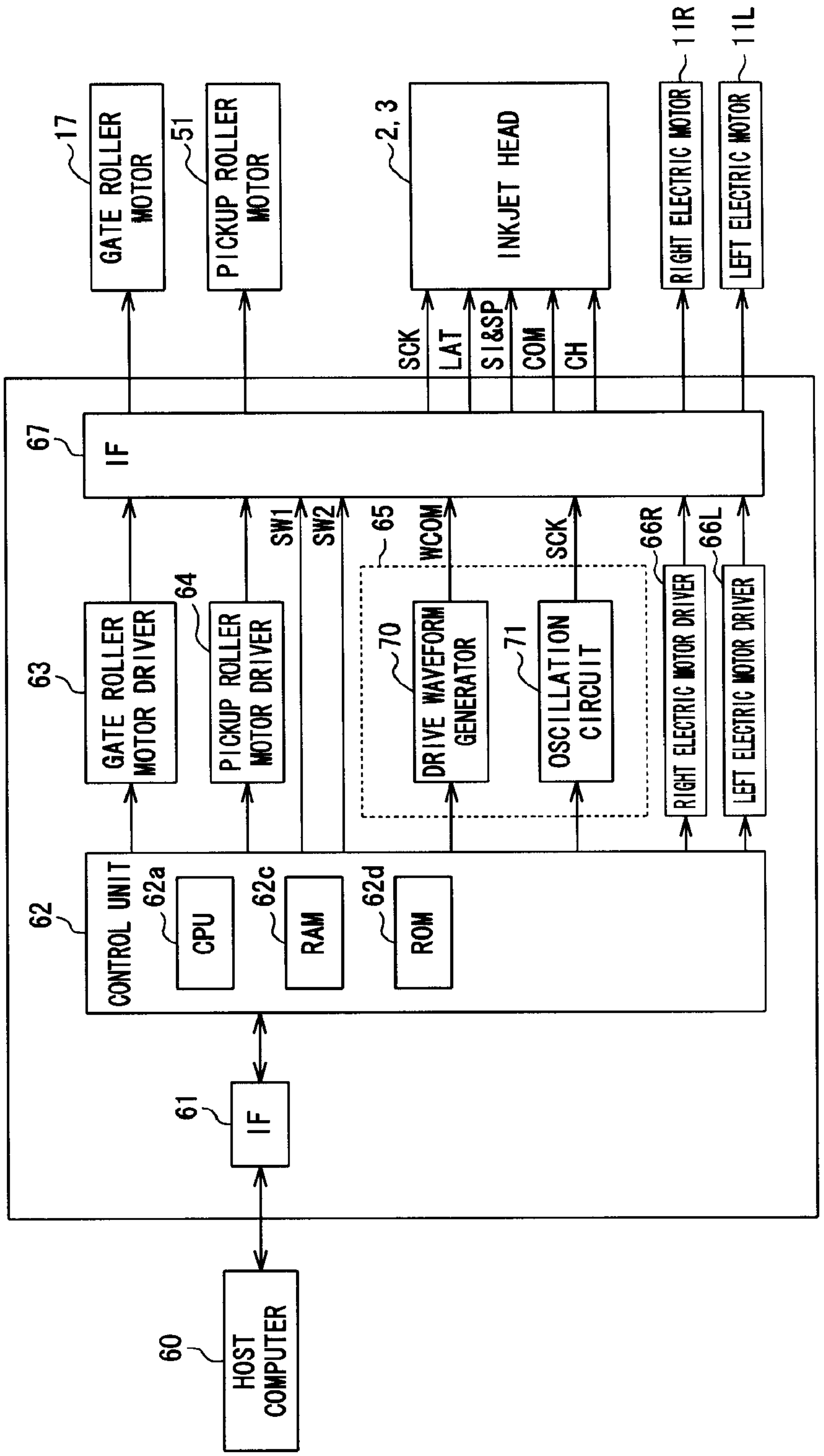
FIG. 2 is a block diagram of a control unit of the inkjet printer of FIGS. 1A and 1B.

The inkjet printer includes a control unit that controls the printer itself. The control unit processes printing on a print medium by controlling a print unit or a paper feed unit based on print data input from a host computer 60 such as a personal computer or a digital camera, as shown in FIG. 2. The control unit includes: an input interface unit 61 for receiving print data input from the host computer 60; a control unit 62 comprising a microcomputer for executing print processing based on the print data input from the input interface 61; a gate roller motor driver 63 for controlling drive of the gate roller motor 17; a pickup roller motor driver 64 for controlling drive of a pickup roller motor 51 for driving the pickup roller 16; a head driver 65 for controlling drive of the inkjet heads 2 and 3; a right electric motor driver 66R for controlling drive of the right electric motor 11R; a left electric motor driver 66L for controlling drive of the left electric motor 11L; and an interface 67 for converting an output signal from each of the drivers 63 to 65, 66R and 66L into a drive signal used in the external gate roller motor 17, the pickup roller motor 51, the inkjet heads 2 and 3, the right electric motor 11R and the left electric motor 11L and outputting the signal.

The control unit 62 includes: a CPU (Central Processing Unit) 62*a* for executing various processing such as print processing; a RAM (Random Access Memory) 62*c* for temporally storing print data input via the input interface 61 or various data to execute processing such as printing of the print data, or for temporally deploying an application program such as for print processing; and a ROM (Read-Only Memory) 62*d* comprising a non-volatile semiconductor memory for storing a control program executed by the CPU 62*a*. When the control unit 62 obtains print data (image data) from the host computer 60 via the interface 61, the CPU 62*a* executes pre-determined processing on the print data, outputs print data drive pulse selection data SI&SP) including which nozzle jets ink drops or how many ink drops are jetted, and outputs a control signal to each of the drivers 63 to 65, 66R and 66L based on the print data and input data from various sensors. When each of the drivers 63 to 65, 66R and 66L outputs the control signal, the interface 67 converts the signal into a drive signal, which causes the actuators corresponding to the plurality of nozzles of the inkjet heads, the gate roller motor 17, the pickup roller motor 51, the right electric motor 11R, and the left electric motor 11L to be individually actuated to execute paper feed and conveyor of the print medium 1, posture control of the print medium 1, and print processing onto the print medium 1. Also, the control unit 62 outputs switch drive signals sw1 and sw2 to the low pass filter in a drive signal output circuit, which will be explained later, provided in the interface 67, so that the low pass filter and the low-pass filter in the drive circuit including the actuators of nozzles through which ink drops are jetted remove only certain components or only the components within a predetermined range, so as to make drive signals actually applied to actuators uniform. The respective components of the control unit 62 are electrically connected to one another via a bus (not shown.

Also, the control unit 62 outputs, in order to write waveform forming data DATA for forming a drive signal which will be described later into a waveform memory 701 which will be also described later, a write enable signal DEN, a write clock signal WCLK, and write address data A0 to A3 so that the 16-bit waveform forming data DATA is written into the waveform memory 701. Further, the unit 62 outputs the following to the head driver 65: read address data A0 to A3 to read out the waveform forming data DATA stored in the waveform memory 701; a first clock signal ACLK to set timing to latch the read-out waveform forming data DATA from the waveform memory 701; a second clock signal BCLK to set timing to add the latched waveform data; and a clear signal CLER to clear the latch data.

Figure 3:
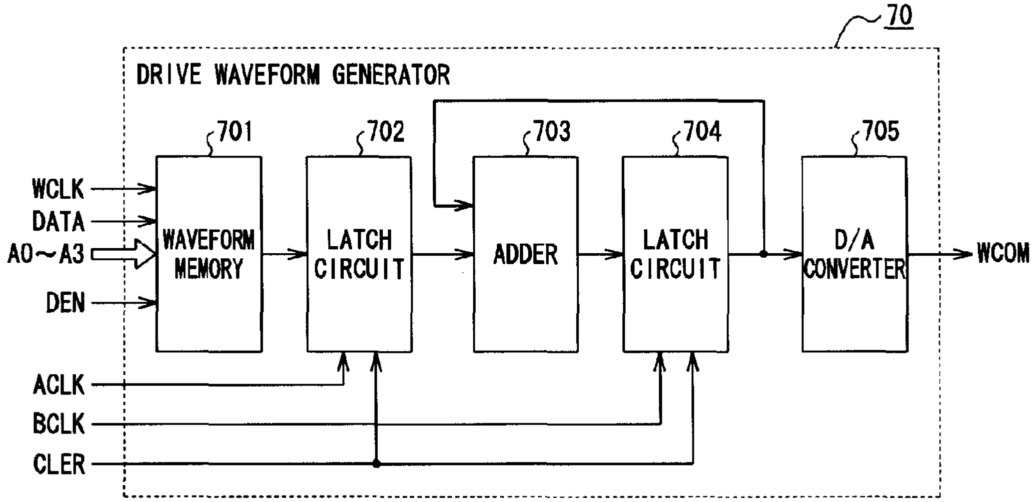
FIG. 3 is a block diagram of a drive waveform generator of FIG. 2.

The head driver 65 includes a drive waveform generator 70 for forming a drive waveform signal WCOM, and an oscillation circuit 71 for outputting a clock signal SCK. The drive waveform generator 70 includes, as shown in FIG. 3: the waveform memory 701 for storing waveform forming data DATA to generate a drive waveform signal input from the control unit 62 into a storage element corresponding to a pre-determined address; a latch circuit 702 for latching the waveform forming data DATA read out from the waveform memory 701 with the first clock signal ACLK described above; an adder 703 for adding an output of the latch circuit 702 and the waveform generation data WDATA output from a latch circuit 704 which will be described next; the latch circuit 704 for latching the added output by the adder 703 with the second clock signal BCLK described above; and a D/A converter 705 for converting the waveform generation data WDATA output from the latch circuit 704 into an analog signal. In this configuration, into the latch circuits 702 and 704 is input a clear signal CLER output from the control unit 62, and when the clear signal CLER is turned off, the latch data is cleared.

Figure 4:
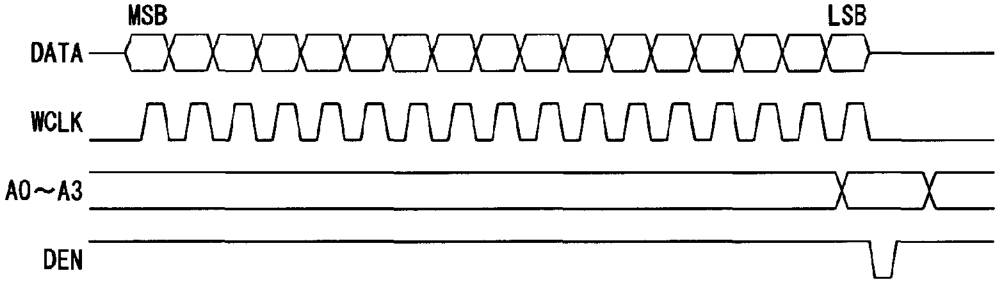
FIG. 4 is a diagram illustrating a waveform memory of FIG. 3.

The waveform memory 701 has several bit memory elements arranged therein at each designated address in which addresses A0 to A3 and the waveform data DATA are stored, as shown in FIG. 4. Specifically, the clock signal WCLK and the waveform data DATA are input to the addresses A0 to A3 designated by the control unit 62, and an input of the write enable signal DEN causes the waveform data DATA to be stored in the memory elements.

Next, a principle of drive waveform signal generation by the drive waveform generator 70 will be described. First, waveform data which involves a voltage change amount of 0 per unit time is written at the address A0 described above. Similarly, waveform data +ΔV1 is written at the address A1, waveform data −ΔV2 is written at the address A2, and waveform data +ΔV3 is written at the address A3. The clear signal CLER clears data saved in the latch circuits 702 and 704. The drive waveform signal WCOM rises to a midpoint potential (offset) according to the waveform data.

Figure 5:
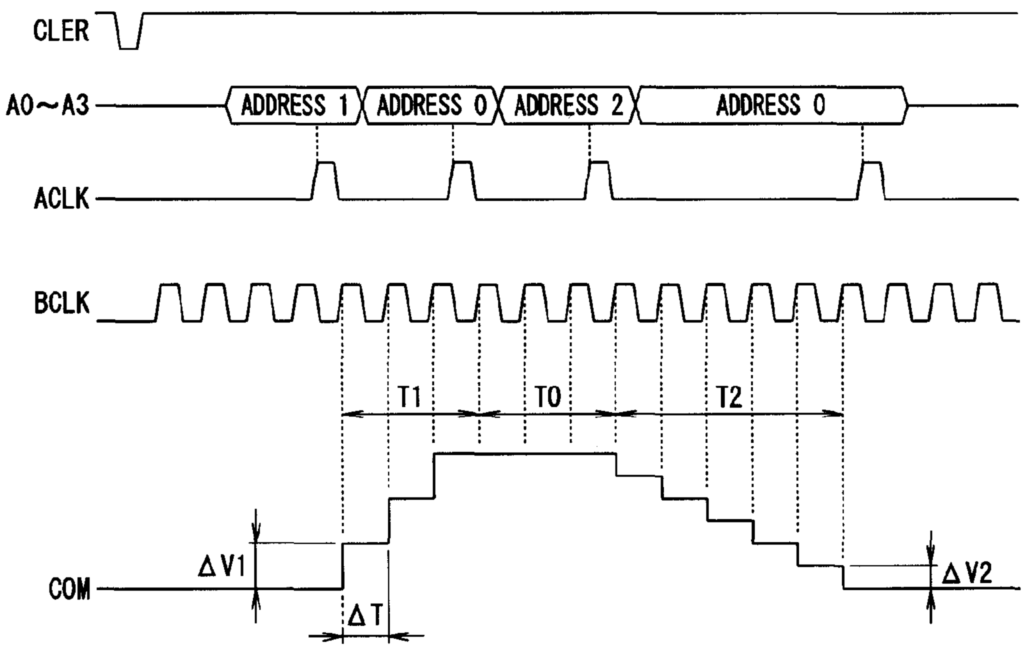
FIG. 5 is a diagram illustrating drive waveform signal generation.

In the above state, when the waveform data at the address A1 is read and the first clock signal ACLK is input, the digital data +ΔV1 is saved in the latch circuit 702, as shown in FIG. 5. The saved digital data +ΔV1 is input to the latch circuit 704 via the adder 703. The latch circuit 704 saves output of the adder 703 in synchronization with a rise of the second clock signal BCLK. The output of the latch circuit 704 is also input to the adder 703. Accordingly, the output of the latch circuit 704, i.e., the drive signal COM is incremented by +ΔV1 whenever the second clock signal BCLK rises. In this example, the waveform data at the address A1 is read in a duration T1, and as a result, the signal COM is incremented until the digital data +ΔV1 is tripled.

Then, when the waveform data at the address A0 is read and the first clock signal ACLK is input, digital data saved in the latch circuit 702 switches to 0. The digital data 0 goes through the adder 703 to be incremented whenever the second clock signal BCLK rises, similarly to the above description. However, since the digital data is 0, a previous value is substantially retained. In this example, the drive signal COM is retained at a certain value in a duration T0.

Then, when the waveform data at the address A2 is read and the first clock signal ACLK is input, digital data saved in the latch circuit 702 switches to −ΔV2. The digital data −ΔV2 goes through the adder 703 to be incremented whenever the second clock signal BCLK rises, similarly to the above description. However, since the digital data is −ΔV2, the drive signal COM is substantially decremented by −ΔV2 according to the second clock signal. In this example, the signal COM is decremented in a duration T2 until the digital data −ΔV2 becomes sixfold.

Figure 6:
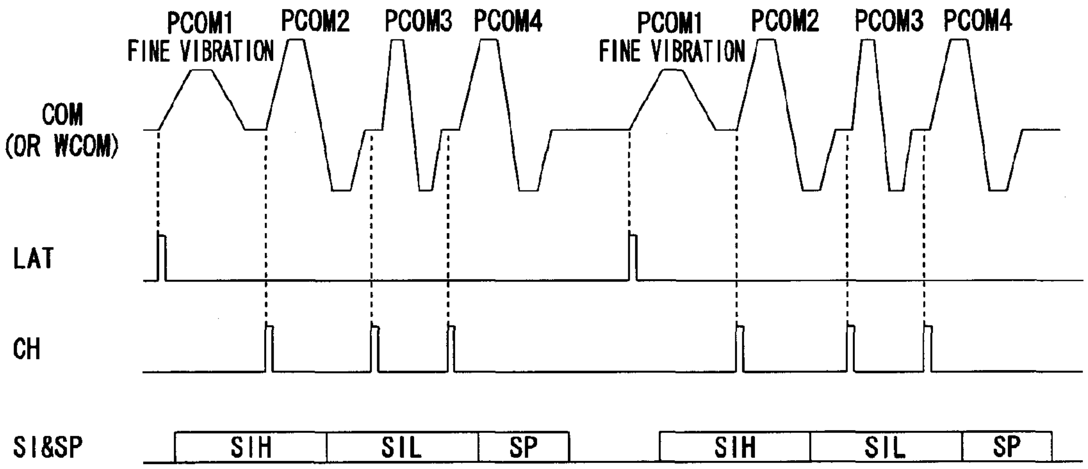
FIG. 6 is a diagram illustrating the drive waveform signals or drive signals connected sequentially in time.
Figure 7:
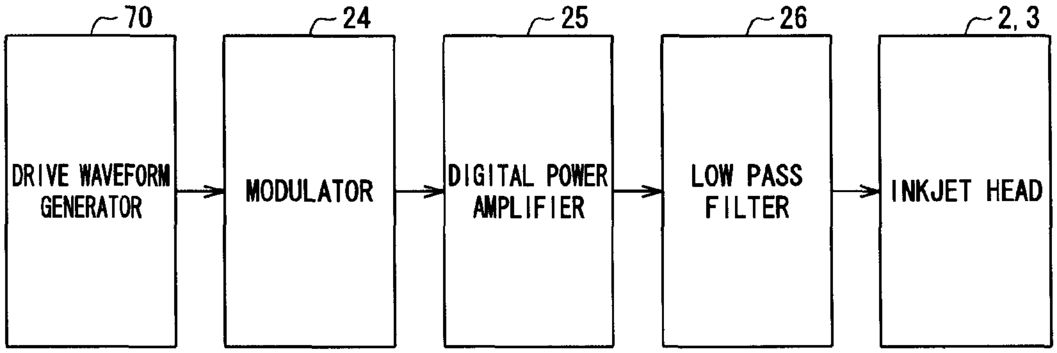
FIG. 7 is a block diagram of a drive signal output circuit.

When the digital signal generated in the above manner is converted into an analog signal by the D/A converter 705, a drive waveform signal WCOM as shown in FIG. 6 is gained. Then, a drive signal output circuit shown in FIG. 7 amplifies the power of the analog signal and supplies the signal as a drive signal COM to the inkjet heads 2 and 3, which can cause the actuators such as piezoelectric elements provided to the respective nozzles to be driven, so that each nozzle can jet ink drops. The drive signal output circuit is configured with: a modulator 24 for modulating a pulse of a drive waveform signal WCOM generated by the drive waveform generator 70; a digital power amplifier 25 for amplifying power of the modulated (PWM) signal subjected to the pulse modulation by the modulator 24; a low pass filter 26 for smoothing the modulated (PWM) signal subjected to the power amplification by the digital power amplifier 25.

A rise time of the drive signal COM corresponds to a stage in which the volume of a cavity (pressure chamber) communicating with a nozzle is increased to pull in ink (which may be expressed as pull in meniscus, from the viewpoint of the ink-jetted surface), while a fall time of the drive signal COM corresponds to a stage in which the volume of the cavity is decreased to push the ink out (which may be expressed as push out meniscus, from the viewpoint of the ink-jetted surface). As a result of the push-out of ink, the nozzle jets ink drops. A waveform of the drive signal COM or the drive waveform signal WCOM can be modified with waveform data 0, +ΔV1, −ΔV2, and +ΔV3 written at the addresses A0 to A3, the first clock signal ACLK, and the second clock signal BCLK, as can be readily inferred from the above description.

A voltage gradient of a drive signal and a peak voltage of the drive signal COM in a voltage trapezoid wave may be variously changed, so that an amount and a speed of ink to be pulled in, and an amount and a speed of ink to be pushed out can be changed, which changes an amount of ink drops to be jetted so as to gain different sizes of ink dots. Thus, after a plurality of drive signals COM are sequentially connected in time to generate drive signals COM as shown in FIG. 6, a single drive signal COM may be selected from the signals to be supplied to the actuator 22 such as a piezoelectric element for one ejection of an ink drop, or a plurality of drive signals COM may be selected to be supplied to the actuators 22 such as piezoelectric elements for multiple ejections of ink drops, thereby various sizes of ink dots can be formed. That is, if a plurality of ink drops is dripped at the same position while the ink is not dried up, the same result can be substantially obtained as in the case where a large ink drop is jetted, and the size of an ink dot can be increased. Such a combination of techniques enables a multi-level tone to be accomplished. The drive pulse on the left end of FIG. 6 only pulls in ink, but does not push out ink. This is called fine vibration which is used to inhibit or prevent a nozzle from being dried without ejection of ink drops.

As a result, the following are input to the inkjet heads 2 and 3: the drive signal COM generated by the drive signal output circuit; a drive pulse selection data SI&SP which selects a nozzle for ejection based on print data and determines a timing of connection to the drive signal COM of an actuator such as a piezoelectric element; a latch signal LAT and a channel signal CH which connects the drive signal COM and the actuators of the inkjet heads 2 and 3 based on the drive pulse selection data SI&SP after nozzle selection data is input to all of the nozzles; and a clock signal SCK which transmits the drive pulse selection data SI&SP as a serial signal to the inkjet heads 2 and 3. Hereinafter, when a plurality of drive signals COM are sequentially connected in time to be output, a single drive signal COM is referred to as a drive pulse PCOM, and when the drive pulses PCOM are sequentially connected in time, the whole signals are referred to as a drive signal COM.

Figure 8:
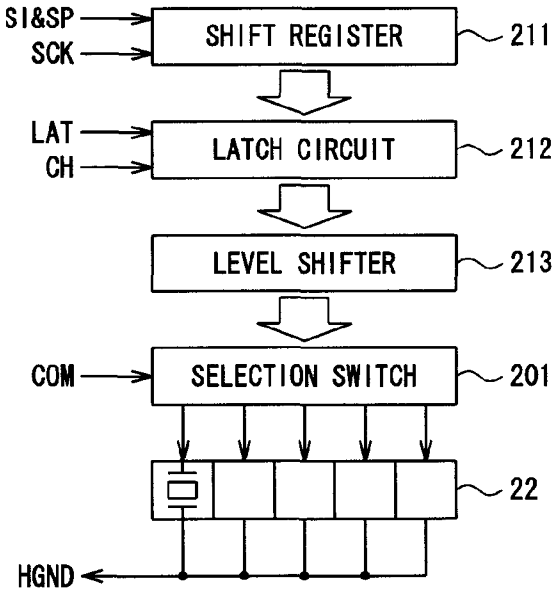
FIG. 8 is a block diagram of a selector for connecting a drive signal to an actuator.

Next, a structure to connect a drive signal COM output from the drive signal output circuit to the actuator such as a piezoelectric element will be described. FIG. 8 is a block diagram of a selector for connecting a drive signal COM to an actuator such as a piezoelectric element. The selector is configured with: a shift register 211 for saving drive pulse selection data SI&SP to specify an actuator such as a piezoelectric element corresponding to a nozzle through which ink drops are jetted; a latch circuit 212 for temporarily saving data of the shift register 211; a level shifter 213 for converting a level of an output of the latch circuit 212; and a selection switch 201 for connecting a drive signal COM to an actuator such as a piezoelectric element in response to an output of the level shifter.

To the shift register 211, drive pulse selection data SI&SP are sequentially input, and also a storage area thereof is sequentially shifted from a first stage to a subsequent stage in response to an input pulse of a clock signal SCK. After drive pulse selection data SI&SP for the number of nozzles is stored in the shift register 211, the latch circuit 212 latches each output signal of the shift register 211 according to an input latch signal LAT. The level of a signal saved in the latch circuit 212 is converted into a voltage level which enables a turning on/off of the selection switch 201 in a next stage by the level shifter 213. This operation is required because the drive signal COM has a voltage higher than an output voltage of the latch circuit 212, and accordingly the selection switch 201 is set to operate at a high operating voltage range. Thus, the actuator such as a piezoelectric element in which the selection switch 201 is closed by the level shifter 213 is connected to the drive signal COM at a timing to connect the drive pulse selection data SI&SP. After drive pulse selection data SI&SP of the shift register 211 is saved in the latch circuit 212, next print information is inputted to the shift register 211, and data saved in the latch circuit 212 is sequentially updated at a timing to jet ink drops. Reference character HGND in the drawing denotes a ground terminal of the actuator such as a piezoelectric element. According to the selection switch 201, an input voltage of the actuator 22 is maintained at the voltage just before the actuator such as a piezoelectric element is separated from the drive signal COM even after the separation.

Figure 9:
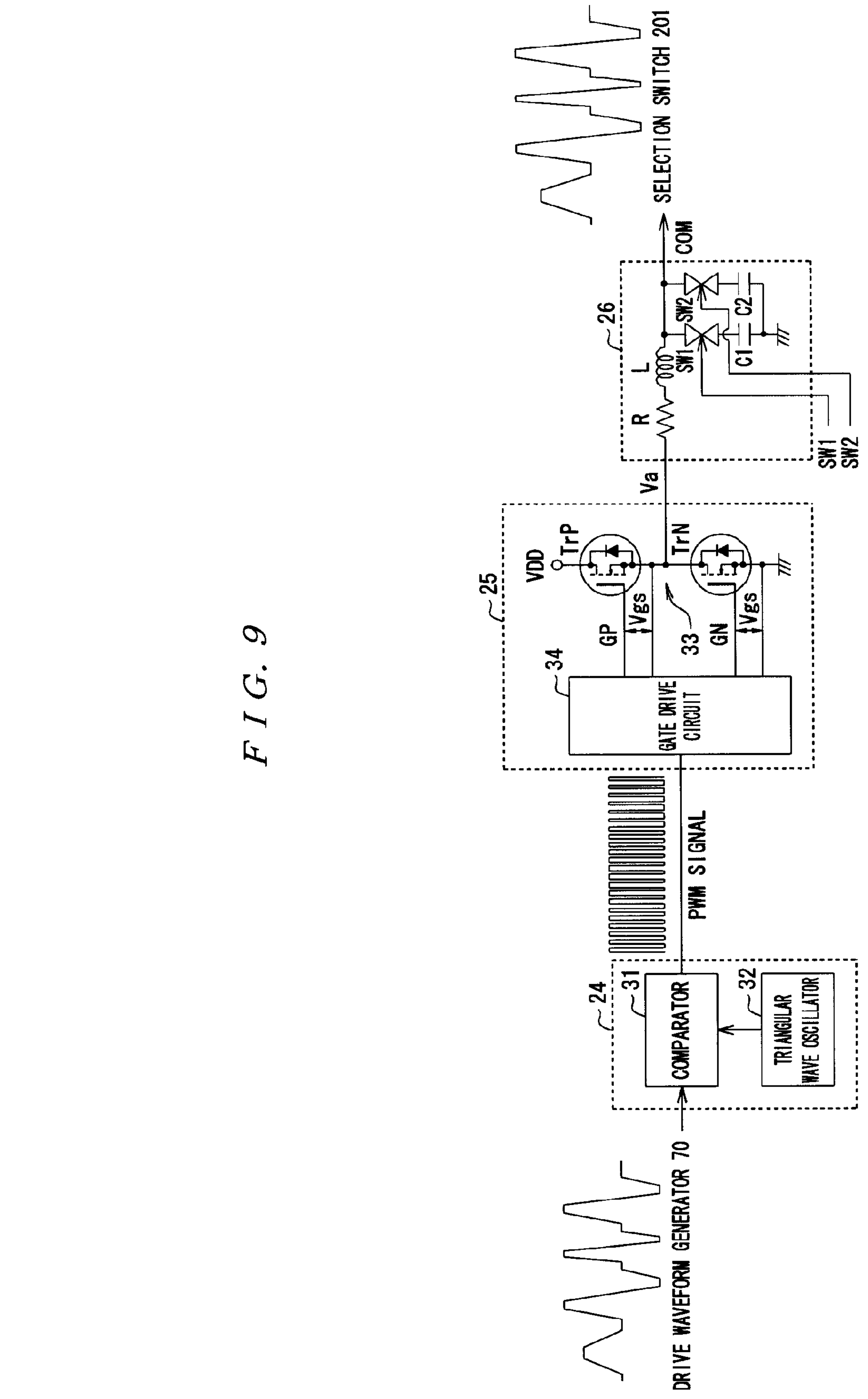
FIG. 9 is a block diagram showing details of a modulator, a digital power amplifier and a low pass filter of the drive signal output circuit of FIG. 7.
Figure 10:
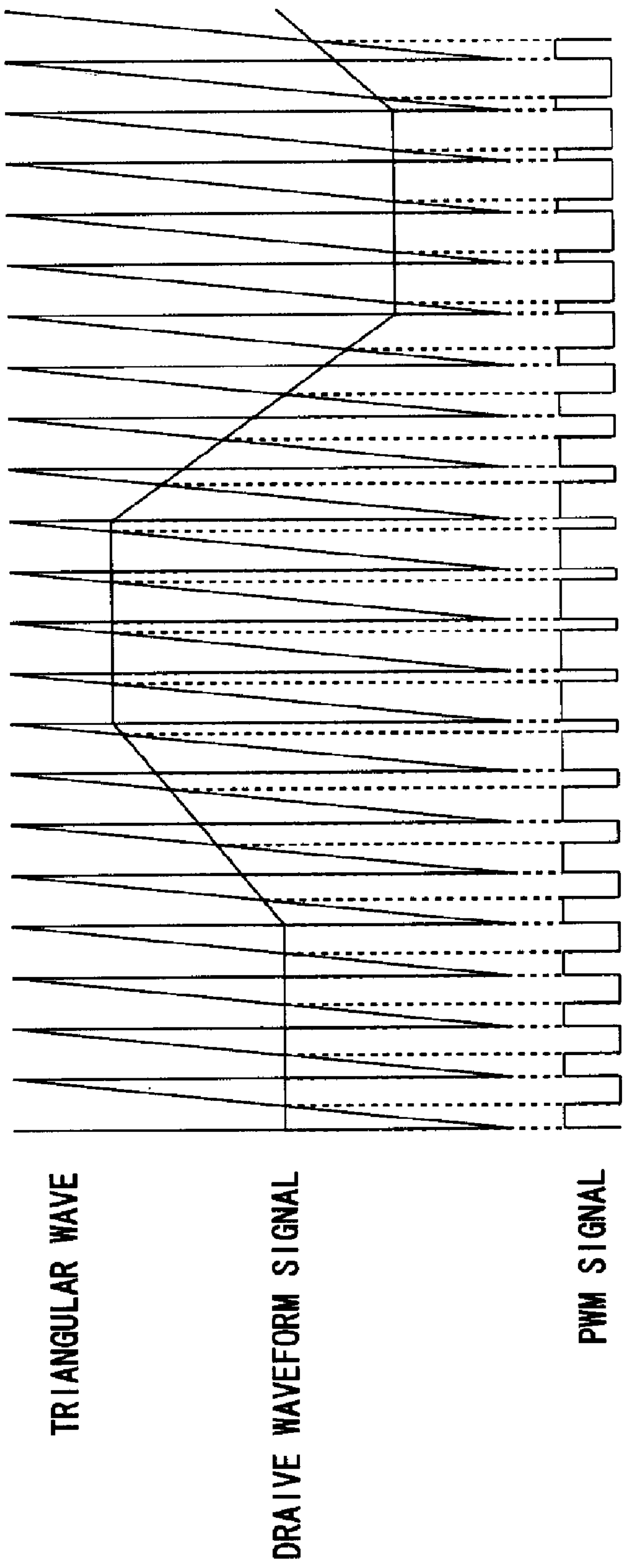
FIG. 10 is a diagram illustrating an operation of the modulator of FIG. 9.

FIG. 9 shows a specific configuration between the modulator 24 of the drive signal output circuit and the low pass filter 26 described above. A general pulse width modulator (PWM) was used for the modulator 24 for modulating a pulse of a drive waveform signal WCOM. The pulse width modulator 24 is configured with a known triangular wave oscillator 32, and a comparator 31 for comparing a triangular wave output from the triangular wave oscillator 32 and the drive waveform signal WCOM. According to the pulse width modulator 24, as shown in FIG. 10, a modulated (PWM) signal Hi is output when the drive waveform signal WCOM is equal to a triangular wave or more, and a modulated (PWM) signal Lo is output when the drive waveform signal WCOM is smaller than a triangular wave. In the present embodiment, a pulse width modulator is used as a modulator, but a pulse density modulator (PDM) may be employed instead.

Figure 11:
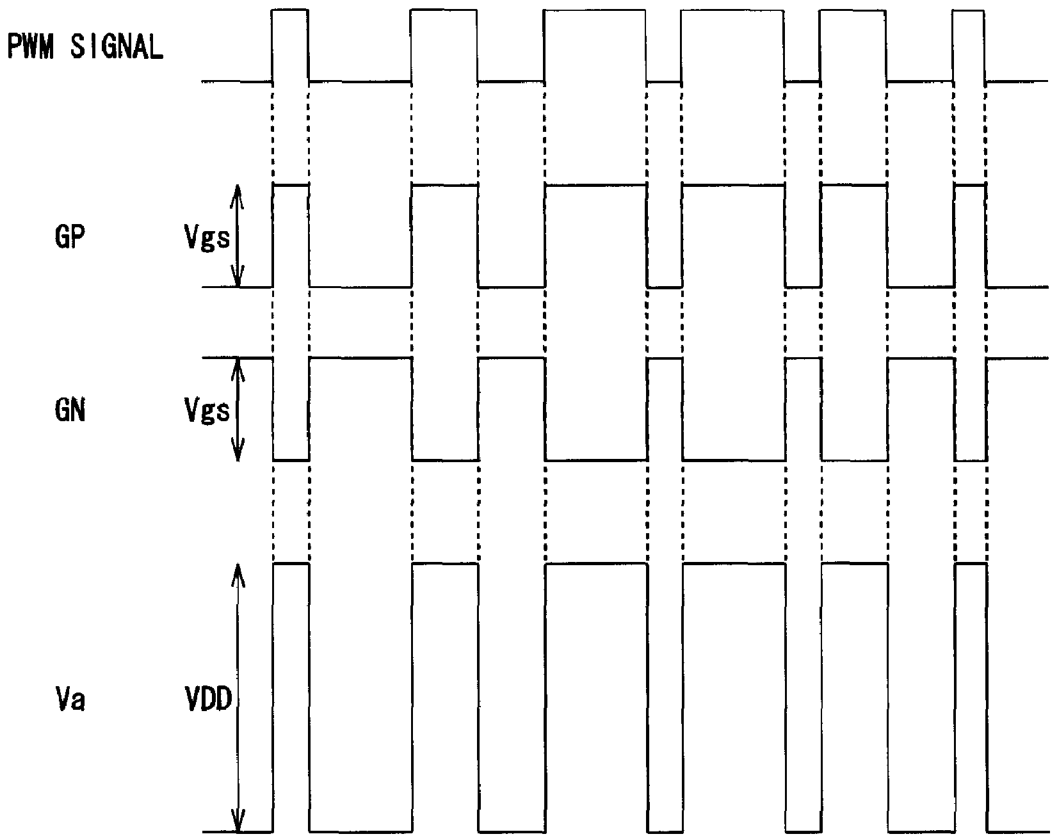
FIG. 11 is a diagram illustrating an operation of the digital power amplifier of FIG. 9.

The digital power amplifier 25 is configured with a half bridge driver stage 33 including both a MOSFETTrP and a MOSFETTrN which substantially amplify power, and a gate drive circuit 34 for modifying the gate-source signals GP and GN of the MOSFETTrP and TrN based on a modulated (PWM) signal from the modulator 24. The half bridge driver stage 33 is a push-pull combination of the high-side MOSFETTrP and the low-side MOSFETTrN. FIG. 11 shows the changes of GP, GN and Va in response to a modulated (PWM) signal, where GP is gate-source signal of the high-side MOSFETTrP, GN is gate-source signal of the low-side MOSFETTrN, and Va is output of the half bridge driver stage 33. The gate-source signals GP and GN of the MOSFETTrP and MOSFETTrN have a sufficient voltage value Vgs to turn ON the MOSFETTrP and MOSFETTrN, respectively.

With a modulated (PWM) signal at Hi level, the gate-source signal GP of the high-side MOSFETTrP is at Hi level and the gate-source signal GN of the low-side MOSFETTrN is at Lo level. Thus, the high-side MOSFETTrP is turned into an ON state and the low-side MOSFETTrN is turned into an OFF state. As a result, the output Va from the half bridge driver stage 33 is turned to be a supply power VDD. Meanwhile, with a modulated (PWM) signal at Lo level, the gate-source signal GP of the high-side MOSFETTrP is at Lo level, and the gate-source signal GN of the low-side MOSFETTrN is at Hi level. Thus, the high-side MOSFETTrP is turned into an OFF state and the low-side MOSFETTrN is turned into an ON state. As a result, the output Va from the half bridge driver stage 33 becomes 0.

The output Va from the half bridge driver stage 33 of the digital power amplifier 25 is supplied as a drive signal COM to the selection switch 201 via the low pass filter 26. The low pass filter 26 is configured with a low-pass filter including a combination of one resistor R, one inductance L, and two capacitances C1 and C2. The low pass filter 26 having the low-pass filter is designed to sufficiently attenuate a high-frequency component, i.e., an amplified digital signal component of an output Va from the half bridge driver stage 33 of the digital power amplifier 25, and not to attenuate a drive signal component COM (or drive waveform component WCOM). Between the two capacitances C1 and C2 and a signal line of an amplified digital signal, switches SW1 and SW2 are interposed for connecting each of the capacitances C1 and C2 to the signal line, which are opened/closed by the switch drive signals sw1 and sw2 from the above described control unit 62 respectively. In the present embodiment, the first capacitance C1 is larger than the second capacitance C2.

As described above, when the MOSFETTrP and TrN of the digital power amplifier 25 are digitally driven, the MOSFETs operate as switch elements so that currents flow into the ON-state MOSFETs. However, a drain-source resistance value is very small, hence almost no power loss is generated. On the other hand, no current flows into the OFF-state MOS- FETs, thereby no power loss is generated. Thus, the power loss of the digital power amplifier 25 is extremely small, as the result of that small MOSFETs can be used, and a cooling unit such as a cooling plate radiator can be eliminated. While a transistor is linearly driven at an efficiency of about 30%, a digital power amplifier can be driven at an efficiency of 90% or more. In addition, since one transistor requires a cooling plate radiator of 60 mm square, the elimination of such a cooling plate radiator provides a distinct advantage in an actual layout.

Figure 12A:
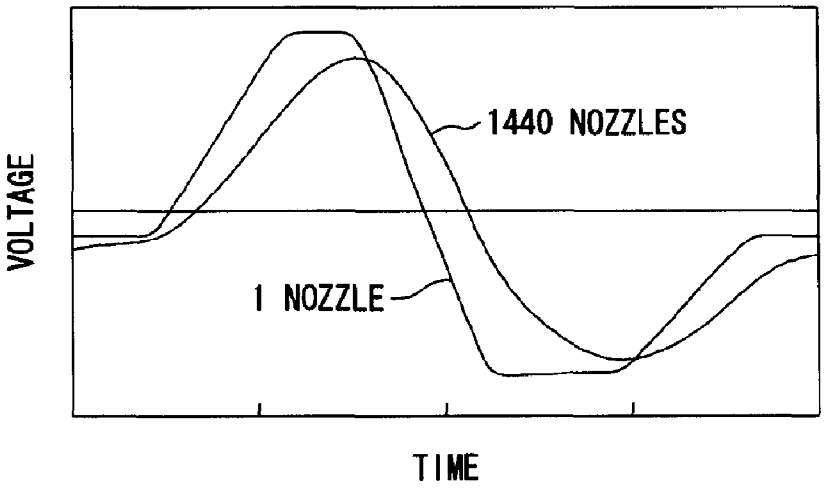
FIG. 12A is a diagram illustrating a change in a drive signal depending on the number of connected actuators; and 12B is a diagram illustrating frequency characteristics of a drive circuit.
Figure 12B:
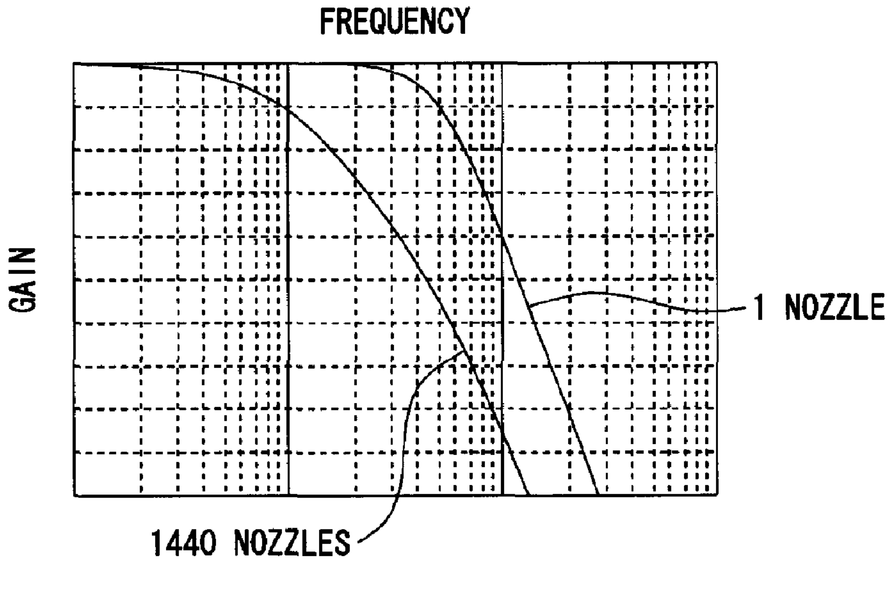
Figure 13A:
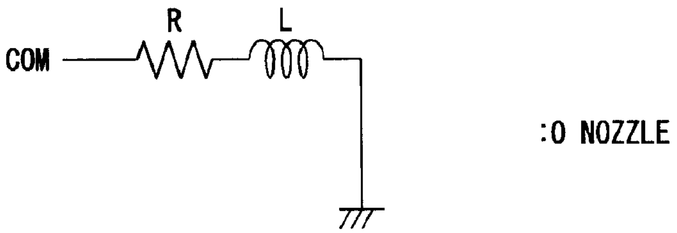
FIGS. 13A, 13B, 13C and 13D are the diagrams illustrating of a low-pass filter configured with connected actuators.
Figure 13B:
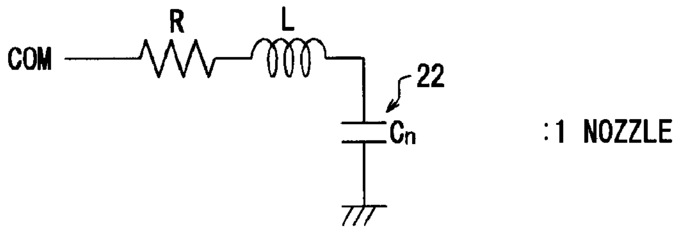
Figure 13C:
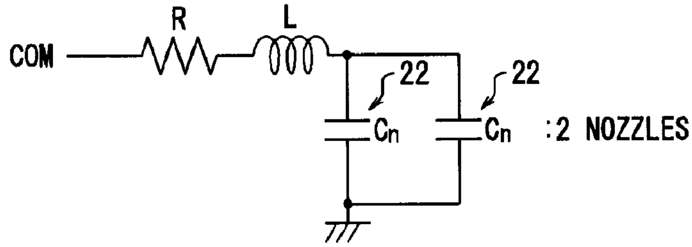
Figure 13D:
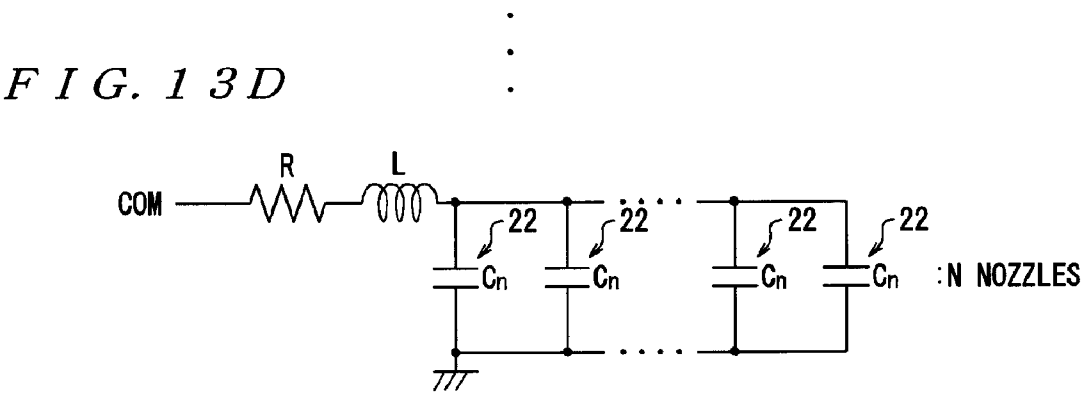

Next, the switch drive signals sw1 and sw2 output from the control unit 62 will be described below. For example, when one actuator 22 such as a piezoelectric element is connected as shown in FIG. 12A, the trapezoidal waveform of a drive pulse PCOM or drive signal COM is rounded off upon the connection of a plurality of actuators 22 such as piezoelectric elements (1440 nozzle of FIG. 12A). Actual measurements of the frequency characteristics of a drive circuit with actuators 22 such as piezoelectric elements demonstrate lower gains as a result of the increased number of the actuators 22 in connection. This is because the actuators 22 such as piezoelectric elements are connected in parallel by the above described selector. The actuator 22 such as a piezoelectric element has a capacitance Cn. For example, whenever an additional actuator 22 such as a piezoelectric element is connected to a resistor R and an inductance L of the low pass filter 26 shown in FIG. 13A, the additional capacitance Cn of the actuator 22 such as a piezoelectric element is connected in parallel as shown in FIGS. 13*b*, 13*c*, and 13*d*, resulting in that the whole drive circuit forms a low-pass filter. Needless to say, any drive signal COM or drive pulse PCOM is rounded off and supplied to the drive circuit which is a low-pass filter as a whole, without any high frequency component.

Figure 14:
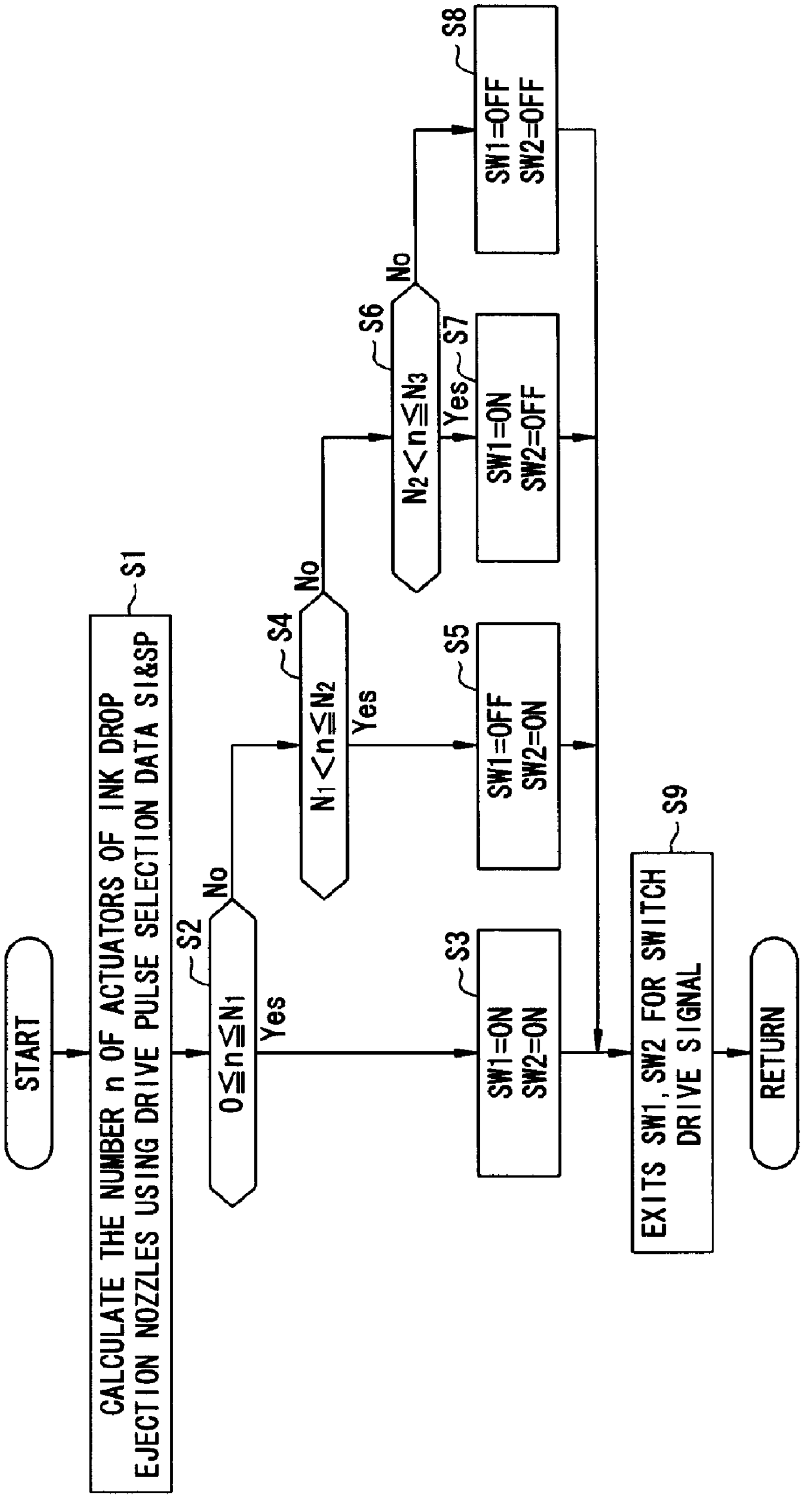
FIG. 14 is a flowchart showing a calculation processing for setting a switch drive signal.

In the present embodiment, the capacitances C1 and C2 provided in the low pass filter 26 are selectively connected to the drive circuit so as to limit the characteristics of the low-pass filter of the whole drive circuit to a certain amount or within a predetermined range, so that drive signals actually applied to actuators can be uniform. Specifically, a calculation processing shown in FIG. 14 is performed in the control unit 62, and switch drive signals sw1 and sw2 are generated and output based on the calculation result, and the capacitances C1 and C2 in the low pass filter 26 are appropriately connected. In the calculation processing, first, as Step S1, the number n of the actuators of nozzles for jetting ink drops (hereinafter, also referred to as the number of driving actuators) is calculated using drive pulse selection data SI&SP.

Then, the processing goes to Step S2, where it is determined if the number n of driving actuators calculated at Step S1 is equal to 0 or more up to a first predetermined value N1 or not, and when the number n of driving actuators is equal to 0 or more up to a first predetermined value N1, the processing goes to Step S3, or otherwise the processing goes to Step S4.

At Step S4, it is determined if the number n of driving actuators calculated at Step S1 is above the first predetermined value N1 and also equal to a second predetermined value N2 or less which is larger than the first predetermined value N1 or not, and when the number n of driving actuators is above the first predetermined value N1 and also equal to the second predetermined value N2 or less, the processing goes to Step S5, or otherwise the processing goes to Step S6.

At Step S6, it is determined if the number n of driving actuators calculated at Step S1 is above the second predetermined value N2 and also equal to a third predetermined value N3 or less which is larger than the second predetermined value N2 or not, and when the number n of driving actuators is above the second predetermined value N2 and also equal to the third predetermined value N3 or less, the processing goes to Step S7, or otherwise the processing goes to Step S8.

At Step S3, the first switch drive signal sw1 is set to be ON, and the second switch drive signal sw2 is set to be ON, and then the processing goes to Step S9.

At Step S5, the first switch drive signal sw1 is set to be OFF, and the second switch drive signal sw2 is set to be ON, and then the processing goes to Step S9.

At Step S7, the first switch drive signal sw1 is set to be ON, and the second switch drive signal sw2 is set to be OFF, and then the processing goes to Step S9.

At Step S8, the first switch drive signal sw1 is set to be OFF, and the second switch drive signal sw2 is set to be OFF, and then the processing goes to Step S9.

At Step S9, the first and second switch drive signals sw1 and sw2 are output, and then the processing returns to the main program.

Figure 15:
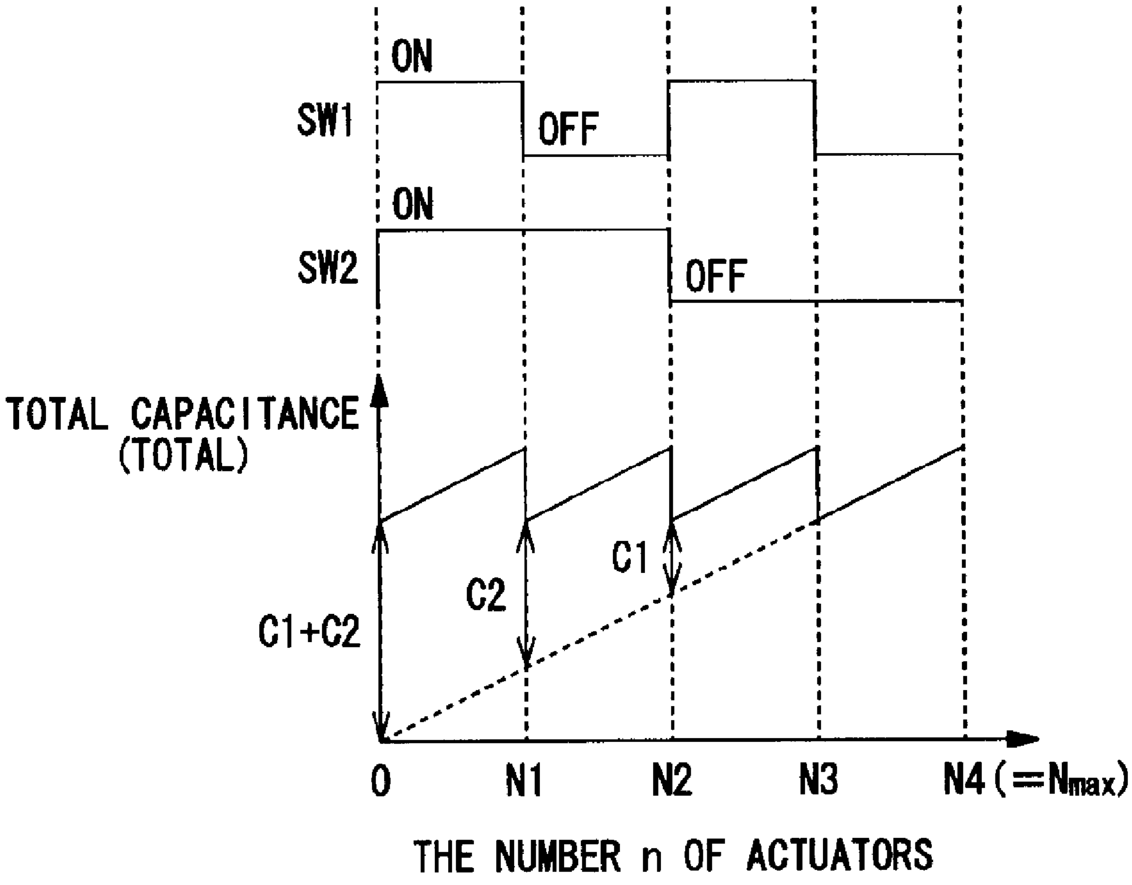
FIG. 15 is a diagram illustrating a total capacitance of a drive circuit by the calculation processing of FIG. 14.

According to the calculation processing, when the number n of driving actuators, that is, the number of the actuators 22 such as piezoelectric elements which are connected to a drive signal COM (drive circuit) is equal to 0 or more up to a first predetermined value N1, the first capacitance C1 and the second capacitance C2 are connected to the drive circuit; when the number of the driving actuators 22 is above the first predetermined value N1 and also equal to the second predetermined value N2 or less, the second capacitance C2 is connected to the drive circuit; when the number of driving actuators 22 is above the second predetermined value N2 and also equal to the third predetermined value N3 or less, the first capacitance C1 is connected to the drive circuit; when the number of driving actuators 22 is above the third predetermined value N3 (and equal to the maximum value N4 or less), no capacitance is connected. As described above, and also as shown by the broken line of FIG. 15, since the capacitances of the drive circuit are increased as the number of the driving actuators 22 connected to the drive signal COM (drive circuit) is increased, the total capacitance $C_{TOTAL}$ of the drive circuit of the present embodiment changes as shown by the solid line of FIG. 15.

Therefore, in the present embodiment, the capacitances connected to the drive circuit are increased for the smaller number of the driving actuators 22, so as to limit the capacitance of the whole drive circuit to a predetermined range, and then to limit the components removed by the low-pass filter in the drive circuit to a predetermined range, which makes the drive signals COM actually applied to the driving actuators 22 uniform. That is, in the present embodiment, the value of the capacitance which is connected to a drive circuit (drive signal COM) is changed depending on the number of the driving actuators 22, which controls the frequency characteristics of the drive circuit itself and makes the drive signals COM actually applied to the actuators 22 uniform. Of course, when the number of the capacitances connectable in parallel to a drive circuit (drive signal COM) is increased and the connected capacitances are finely adjusted depending on the number of the driving actuators 22, the capacitance can be held constant or almost constant for the whole drive circuit, which limits the components removed by the low-pass filter of the drive circuit to a certain amount and makes the drive signals actually applied to the actuators 22 uniform. In the present embodiment, since the low-pass filter in the drive circuit inevitably removes predetermined low frequency components of a drive signal COM, desirably the components are added to drive signals COM or drive waveform signals WCOM in advance.

As described above, according to a head drive apparatus of an inkjet printer of the present embodiment, the drive waveform generator 70 generates a drive waveform signal WCOM as a reference of a signal for controlling the drive of an actuator such as a piezoelectric element, the generated drive waveform signal WCOM is pulse-modulated by the modulator 24 such as a pulse width modulator, the modulated signal which is pulse-modulated is power-amplified by the digital power amplifier 25, and the amplified digital signal which is power-amplified is smoothed by the low pass filter 26 to be supplied to the actuator as a drive signal, thereby the low pass filter 26 has a filter characteristics to sufficiently smooth only the amplified digital signal component, which enables rapid rise and fall of a drive signal to an actuator, and eliminates a cooling unit such as a cooling plate radiator or the like because the digital power amplifier 25 having a high power-amplification efficiency efficiently amplifies the power of a drive signal.

Also, the frequency characteristics of the low pass filter 26 is adjusted depending on the number of the actuators 22 of nozzles for jetting ink drops, thereby the low-pass filter in the drive circuit removes only certain components or only the components within a predetermined range, which makes drive signals COM actually applied to actuators 22 uniform. In addition, a plurality of capacitances C1 and C2 are provided which are connectable in parallel relative to amplified digital signals and switches SW1 and SW2 for individually connecting the capacitances C1 and C2 to the amplified digital signals, thereby the capacitances connected in parallel to amplified digital signals are increased for the smaller number of the actuators 22 of nozzles for jetting ink drops, thereby the low-pass filter in the drive circuit removes only certain components or only the components within a predetermined range, which makes drive signals actually applied to the actuators uniform.

Figure 16:
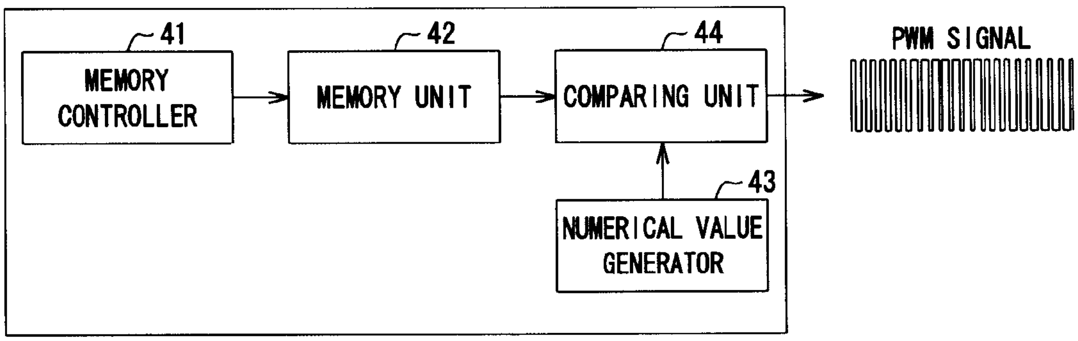
FIG. 16 shows another embodiment of a head drive apparatus of an inkjet printer according to the present invention, and is a block diagram of a drive waveform generator and a modulator thereof.

FIG. 16 shows another embodiment of a drive waveform generator and a modulation section included in a head drive apparatus of an inkjet printer according to the present invention. The drive waveform generator 70 of FIG. 3 converts a digitally composed drive waveform signal into analog by the D/A converter 705, and outputs the analog signal. To the contrary, in FIG. 16, the memory controller 41 reads out digital waveform data from the memory unit 42, so that the read out digital waveform data is compared with the number value of the numerical value generator 43 which corresponds to a triangular wave at the comparing unit 44 to determine Hi and Lo of the modulated (PWM) signal, which is output as a modulated (PWM) signal. In this case, all the processes are digitally controlled up to the output of the modulated (PWM) signal, which allows the memory control unit 41, the memory unit 42, the numerical value generator 43, and the comparing unit 44 to be cooperated in a CPU or a gate array. In this case, the memory controller 41 and the memory unit 42 correspond to drive waveform generator of the present invention, and the numerical value generator 43 and the comparing unit 44 form a modulation section.

Figure 17:
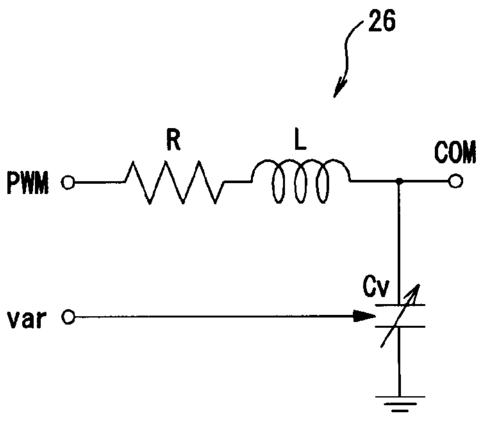
FIG. 17 shows another embodiment of a head drive apparatus of an inkjet printer according to the present invention, and is a block diagram of a low pass filter thereof.

FIG. 17 shows another embodiment of the low pass filter 26. In the embodiment, a variable capacitance Cv is used, and the control unit 62 outputs a control signal cvar to adjust the capacitance of the variable capacitance Cv. According to the embodiment, a capacitance of a low pass filter can be finely adjusted, thereby a low-pass filter in a drive circuit removes only certain components, which makes drive signals actually applied to actuators uniform or almost uniform.

In the above described embodiments, only the example in which a head drive apparatus of an inkjet printer of the present invention is applied to a line head inkjet printer has been explained in detail, but a head drive apparatus of an inkjet printer of the present invention can be applied to any type of inkjet printer including a multi-pass printer.

What is claimed is:

1. A head drive apparatus of an inkjet printer, the head drive apparatus comprising:

- a plurality of nozzles that jet a plurality of liquid drops from an inkjet head;
- a plurality of actuators provided in correspondence to the nozzles; and
- a drive unit that applies a drive signal to the actuators,
- wherein the head drive apparatus includes:
  - a drive waveform generator that generates a drive waveform signal which is used as a reference of a signal to control driving of the actuators;
  - a modulator that modulates a pulse of a drive waveform signal generated by the drive waveform generator;
  - a digital power amplifier that amplifies power of a modulated signal subjected to the pulse modulation by the modulator;
  - a low pass filter that smoothes an amplified digital signal subjected to the power amplification by the digital power amplifier and supplies the signal as the drive signal to the actuators; and
  - a control unit that determines a number of the actuators to be driven by the drive signal and adjusts frequency characteristics of the low pass filter as a function of the number of the actuators to be driven before the drive signal is supplied to the actuators, wherein the control unit adjusts the frequency characteristics by changing a capacitance of the low pass filter.

2. The head drive apparatus of an inkjet printer according to claim 1, characterized in that the low pass filter includes:

- at least one capacitor connected in parallel in the low pass filter to smooth the drive signal; and
- a switch connected to the at least one capacitor,
- wherein the frequency characteristics of the low pass filter are changed by selectively switching the switch to connect the at least one capacitor to the drive unit in response to a switch drive signal generated based on a comparison between the number of actuators to be driven by the drive signal and one or more predetermined number of actuators.

3. The head drive apparatus of an inkjet printer according to claim 2, characterized in that the control unit increases a number of capacitors in the low pass filter to be connected in parallel as the number of the actuators driven by the drive signal decreases.

4. An inkjet printer, comprising the head drive apparatus according to claim 1.

* * * * *